(12) United States Patent
Nagai

(10) Patent No.: US 9,071,032 B2
(45) Date of Patent: Jun. 30, 2015

(54) SUB-MOUNT HAVING PHOTODIODE AND LIGHT-EMITTING ELEMENT MODULE

(75) Inventor: Yoshiteru Nagai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 289 days.

(21) Appl. No.: 13/615,404

(22) Filed: Sep. 13, 2012

(65) Prior Publication Data

US 2013/0068936 A1 Mar. 21, 2013

(30) Foreign Application Priority Data

Sep. 15, 2011 (JP) ................. 2011-201586

(51) Int. Cl.
| | |
|---|---|
| H01S 5/0683 | (2006.01) |
| H01L 25/16 | (2006.01) |
| H01S 5/022 | (2006.01) |
| H01S 5/068 | (2006.01) |

(52) U.S. Cl.
CPC ............ *H01S 5/0683* (2013.01); *H01L 25/167* (2013.01); *H01S 5/0224* (2013.01); *H01S 5/02252* (2013.01); *H01S 5/06804* (2013.01)

(58) Field of Classification Search
USPC ................ 250/208.1, 214.1, 214 R, 208.2; 369/124.12, 125, 284, 44.41; 257/431
See application file for complete search history.

(56) References Cited

U.S. PATENT DOCUMENTS

| | | | |
|---|---|---|---|
| 5,329,136 A * | 7/1994 | Goossen ..................... | 257/17 |
| 6,108,358 A * | 8/2000 | Albers et al. .................. | 372/34 |
| 2005/0111503 A1* | 5/2005 | Ishigami et al. ............ | 372/38.1 |

FOREIGN PATENT DOCUMENTS

| | | |
|---|---|---|
| JP | 06-224465 A | 8/1994 |
| JP | 06-077261 U | 10/1994 |
| JP | 2004-327608 A | 11/2004 |

OTHER PUBLICATIONS

Japanese Office Action dated Jul. 24, 2012 with English translation of its summary.
Japanese Office Action dated Dec. 14, 2012 with English translation of its summary.

* cited by examiner

*Primary Examiner* — Francis M Legasse, Jr.
(74) *Attorney, Agent, or Firm* — Rabin & Berdo, P.C.

(57) ABSTRACT

A sub-mount having a photodiode region, includes a photodiode which has a first conductivity-type layer arranged in a surface portion of the sub-mount of the photodiode region to form a light-receiving surface and a second conductivity-type region arranged below the first conductivity-type layer and is configured to receive at the light-receiving surface a light emitted from a light-emitting element and convert the light into a photocurrent. A peak light-receiving wavelength at which the photocurrent of the photodiode becomes its maximum value is more than or equal to a minimum emission wavelength of the light-emitting element and less than or equal to a maximum emission wavelength of the light-emitting element.

11 Claims, 10 Drawing Sheets

SUB-MOUNT HAVING PHOTODIODE AND LIGHT-EMITTING ELEMENT MODULE

CROSS-REFERENCE TO RELATED APPLICATION

This application is based upon and claims the benefit of priority from Japanese Patent Application No. 2011-201586, filed on Sep. 15, 2011, the entire contents of which are incorporated herein by reference.

TECHNICAL FIELD

The present disclosure relates to a sub-mount with a built-in photodiode, and a light-emitting element module including the sub-mount and a light-emitting element.

BACKGROUND

A laser module includes, for example, a rectangular sub-mount, a laser chip mounted on the sub-mount, and a photodiode (PD) section installed posterior to a portion of the sub-mount on which the laser chip is mounted. The sub-mount is a so-called PD-attached sub-mount.

SUMMARY

The present disclosure describes a sub-mount with a built-in photodiode capable of reducing a fluctuation of light-receiving sensitivity of the photodiode due to changes of temperature and emission wavelength of a light-emitting element, and a light-emitting module.

According to some embodiments, there is provided a sub-mount made of a semiconductor having a photodiode region, including a photodiode having a first conductivity-type layer arranged in a surface portion in the sub-mount of the photodiode region to form a light-receiving surface, and a second conductivity-type region arranged below the first conductivity-type layer. The photodiode is configured to receive at the light-receiving surface a light emitted from a light-emitting element and convert the light into a photocurrent. A peak light-receiving wavelength at which the photocurrent of the photodiode becomes its maximum value is more than or equal to a minimum emission wavelength of the light-emitting element and less than or equal to a maximum emission wavelength of the light-emitting element.

In some embodiments, the peak light-receiving wavelength of the photodiode is within ±5% of a median emission wavelength of the light-emitting element.

In some embodiments, the photodiode is configured to receive a light whose emission wavelength ranges from 790 nm to 845 nm emitted from the light-emitting element, and a depletion layer generated from the first conductivity-type layer has a thickness of 20 μm to 45 μm.

In some embodiments, the first conductivity-type layer has a depth of 1 μm to 5 μm.

In some embodiments, the photodiode includes an i-type semiconductor layer interposed between the first conductive-type layer and the second conductive-type region.

In some embodiments, the second conductivity-type region surrounds a periphery and a bottom portion of the first conductivity-type layer, and a portion of the second conductivity-type region forms a portion of the surface of the sub-mount.

In some embodiments, the photodiode includes a first electrode connected to the first conductivity-type layer and a second electrode connected to the second conductivity-type region, where the first electrode and the second electrode are formed on the surface of the sub-mount.

In some embodiments, the sub-mount is made of Si.

According to another embodiment, a light-emitting element module includes the sub-mount with the built-in photodiode of the present disclosure and a light-emitting element fixed on the surface of the sub-mount in a light-emitting element region adjacent to the photodiode region.

In some embodiments, the light-emitting element module includes a laser diode including a laser-emitting end surface and an opposite end surface opposite the laser-emitting end surface. The laser diode is arranged with the opposite end surface facing the light-receiving surface.

In some embodiments, the light-emitting element module includes a light-emitting diode having a light-emitting surface. The light-emitting diode is arranged with the light-emitting surface facing upward.

BRIEF DESCRIPTION OF THE DRAWINGS

FIG. 8A is a graph showing a temperature characteristic of an emission wavelength of a semiconductor laser diode and FIG. 8B is a graph showing spectral sensitivity characteristic of the photodiode.

FIG. 9A shows a case in which a peak light-receiving wavelength<a minimum emission wavelength, FIG. 9B shows a case in which the minimum emission wavelength≤the peak light-receiving wavelength≤a maximum emission wavelength, and FIG. 9C shows a case in which the maximum emission wavelength<the peak light-receiving wavelength, respectively.

DETAILED DESCRIPTION

Figure 1:
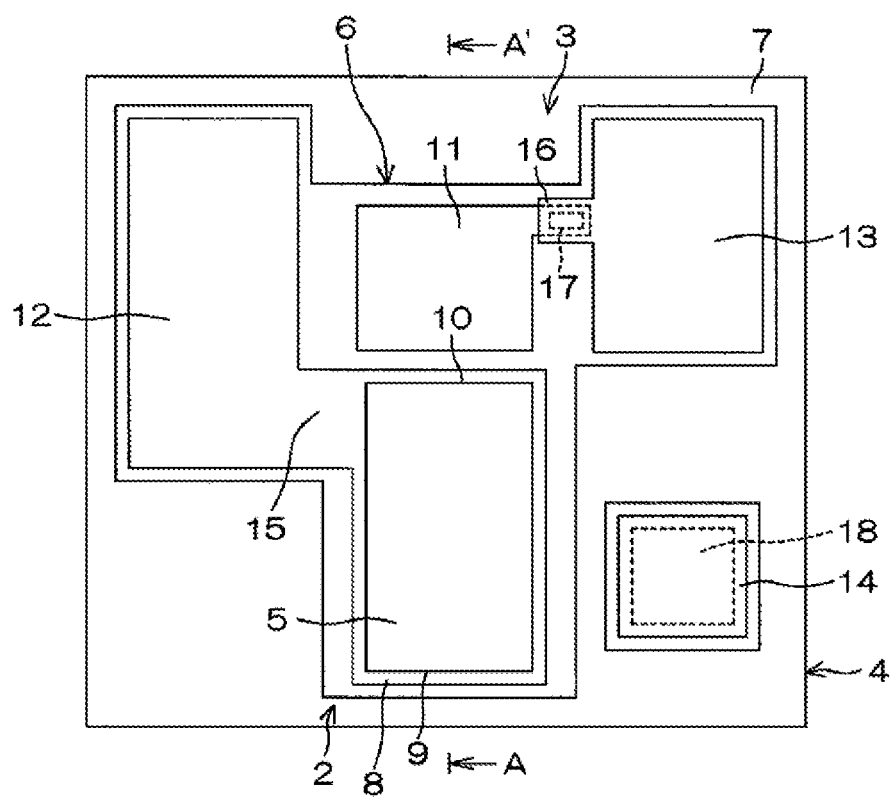
FIG. 1 is a schematic plan view of a laser module according to some embodiments.

FIG. 1 is a schematic plan view of a laser module 1, according to some embodiments. The laser module 1, as a light-emitting element module, may be attached to a thermally-assisted magnetic head slider, for example. The laser module 1 includes a laser diode region 2 (a light-emitting region) and a photodiode region 3 lying next to each other, a sub-mount 4 whose planar shape is rectangular, a semiconductor laser diode 5 provided in the laser diode region 2 and a photodiode 6 provided in the photodiode region 3. The sub-mount 4 has a length of 0.5 mm or more in each of the vertical and horizontal directions on the plane of FIG. 1.

A laser diode (LD) anode pad 8 is formed on a surface 7 of the sub-mount 4 in the laser diode region 2, and the semiconductor laser diode 5 is fixed on the LD anode pad 8. The semiconductor laser diode 5 is an end surface-emitting laser diode having a laser-emitting end surface 9 (a front end surface) and an opposite end surface 10 (a rear end surface) opposite the laser-emitting end surface 9, and the semiconductor laser diode 5 is arranged with the opposite end surface 10 facing the photodiode region 3.

The semiconductor laser diode 5 emits a laser light as an output light from the laser-emitting end surface 9 to the exterior. The semiconductor laser diode 5 also emits a laser light as a monitoring light from the opposite end surface 10 to the photodiode region 3. For example, the semiconductor laser diode 5 may be an InP-based diode, a GaAs-based diode, a GaN-based diode or the like, which are used for communication, optical disc storage or material analysis. In addition, the emission wavelength of the emitted laser light is usually, but not particularly limited to, 375 nm-1.7 µm. In particular, the emission wavelength may be 790 nm-845 nm.

On the other hand, a light-receiving surface 11 of the photodiode 6 is exposed at the surface 7 of the sub-mount 4 in the photodiode region 3. The light-receiving surface 11 faces the opposite end surface 10 of the semiconductor laser diode 5. The photodiode 6 receives, at the light-receiving surface 11, a laser light emitted from the opposite end surface 10, and converts the received laser light into a photocurrent. An LD anode electrode 12, a photo diode (PD) anode electrode 13 as a first electrode of the photodiode 6 and a PD cathode electrode 14 as a second electrode of the photodiode 6 are formed on the surface 7 of the sub-mount 4. The LD anode electrode 12, the PD anode electrode 13 and the PD cathode electrode 14 are arranged so as to interpose the semiconductor laser diode 5 thereamong. In particular, the LD anode electrode 12 is arranged on one side of the semiconductor laser diode 5, and the PD anode electrode 13 and the PD cathode electrode 14 are arranged on the other side of the semiconductor laser diode 5 (an opposite side of the LD anode electrode 12 with respect to the semiconductor laser diode 5) with the semiconductor laser diode 5 interposed therebetween.

In addition, the LD anode electrode 12 is connected to the LD anode pad 8 through a wiring 15. The PD anode electrode 13 is connected to a portion of the light-receiving surface 11 (a PD-p type semiconductor layer 36, which will be described further below) of the photodiode 6 through a wiring 16 and a contact 17, and the PD cathode electrode 14 is connected to the sub-mount 4 (a PD-n type semiconductor layer 35 which will be described below) through a contact 18.

Figure 2:
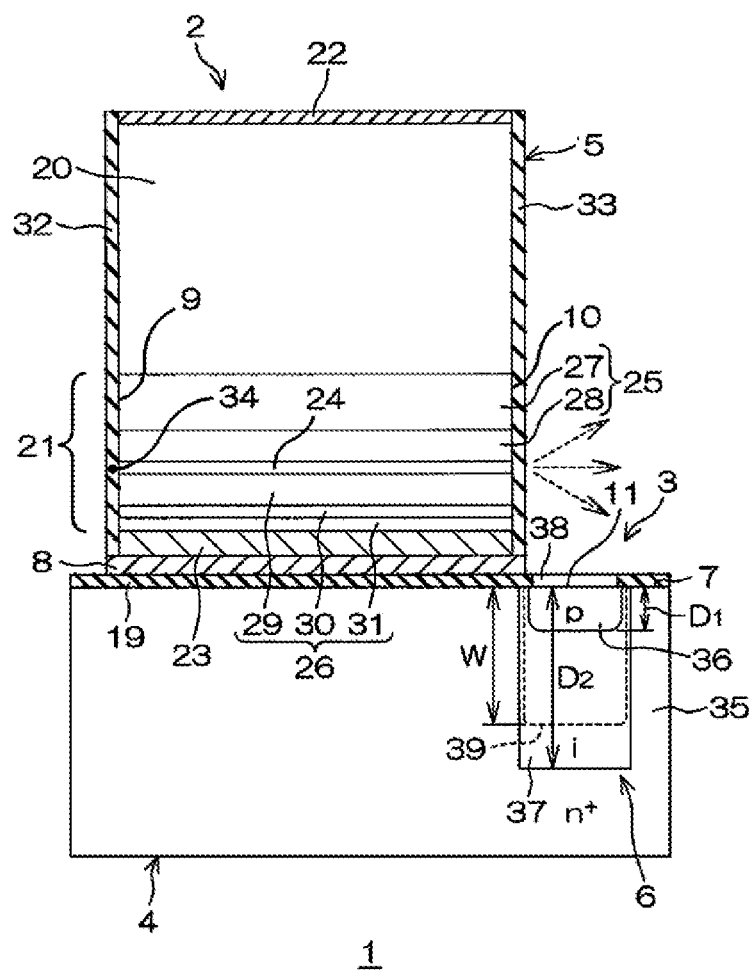
FIG. 2 is a schematic cross-sectional view of the laser module of FIG. 1, which shows a cross section taken along line A-A' in FIG. 1.

Next, a cross-sectional structure of the laser module 1 will be described in detail with reference to FIG. 2. FIG. 2 is a schematic cross-sectional view of the laser module 1 of the FIG. 1 and shows a cross-section taken along line A-A' of FIG. 1. Further, FIG. 2 is depicted in a different scale from that of FIG. 1 for convenience. First, the sub-mount 4 serving as the basis of the laser module 1 is formed of an n-type Si substrate, and the surface 7 of the sub-mount 4 is covered with a surface insulating film 19 composed of $SiO_2$. The LD anode pad 8, the LD anode electrode 12, the PD anode electrode 13 and the PD cathode electrode 14 are provided on the surface insulating film 19. The PD anode electrode 13 and the PD cathode electrode 14 are connected to a PD-p type semiconductor layer 36 and a PD-n type semiconductor layer 35, which will be described further below, through contacts 17 and 18 passing through the surface insulating film 19, respectively. Since the electrodes are provided on the surface insulating film 19, it is possible to insulate the electrodes (pads) from each other.

The semiconductor laser diode 5 is a Fabry-Perot type laser diode which includes a substrate 20, a III-V group semiconductor laminated structure 21 formed by crystal growth on the substrate 20, an n-type electrode 22 formed so as to contact with a rear surface of the substrate 20 (a surface on the opposite side to the III-V group semiconductor laminated structure 21), and a p-type electrode 23 formed so as to contact with a surface of the III-V group semiconductor laminated structure 21. The semiconductor laser diode 5 is fixed to the sub-mount 4 by joining (with the use of solder or the like) the p-type electrode 23 to the LD anode pad 8 on the surface 7 of the sub-mount 4. That is, the semiconductor laser diode 5 is fixed to the sub-mount 4 in a facing downward posture in which the p-type electrode 23 in the opposite side to the substrate 20 faces downward. It will be appreciated that, the joining form of the semiconductor laser diode 5 is not limited to the facing downward posture, but may be a facing upward posture, for example.

The substrate 20 is formed of an n-type GaAs single-crystal substrate in this embodiment. The III-V group semiconductor laminated structure 21 is formed on a main surface of the substrate 20 by crystal growth. The III-V group semiconductor laminated structure 21 includes a light-emitting layer 24, an LD-n type semiconductor layer 25, and an LD-p type semiconductor layer 26. The LD-n type semiconductor layer 25 is arranged in a direction of the substrate 20 with respect to the light-emitting layer 24, and the LD-p type semiconductor layer 26 is arranged in a direction of the p-type electrode 23 with respect to the light-emitting layer 24. The light-emitting layer 24 is interposed between the LD-n type semiconductor layer 25 and the LD-p type semiconductor layer 26, thus forming a double heterojunction structure. Electrons from the LD-n type semiconductor layer 25 and holes from the LD-p type semiconductor layer 26 are injected to the light-emitting layer 24. The electrons and the holes are recombined in the light-emitting layer 24 to generate the light.

The LD-n type semiconductor layer 25 is formed by laminating an n-type InGaAlP clad layer 27 and an n-type InGaAlP guide layer 28 in this order on the substrate 20. On the other hand, the LD-p type semiconductor layer 26 is formed by laminating a p-type InGaAlP guide layer 29, a p-type InGaAlP clad layer 30, and a p-type electrode under layer 31 in this order on the light-emitting layer 24. The n-type InGaAlP clad layer 27 and the p-type InGaAlP clad layer 30 have a function of optical confinement that confines the light from the light-emitting layer 24 therebetween. The n-type InGaAlP clad layer 27 is formed of an n-type semiconductor, for example, by doping Si as an n-type dopant into InGaAlP. The p-type InGaAlP clad layer 30 is formed of a p-type semiconductor, for example, by doping Mg as a p-type dopant into InGaAlP. The n-type InGaAlP clad layer 27 has a band gap wider than that of the n-type InGaAlP guide layer 28, and the p-type InGaAlP clad layer 30 has a band gap wider than that of the p-type InGaAlP guide layer 29. This can make a good confining of light, and the semiconductor laser diode 5 can be realized with low threshold and high efficiency.

The n-type InGaAlP guide layer 28 and the p-type InGaAlP guide layer 29 are semiconductor layers which have a function of confining carriers (electrons and holes) in the light-emitting layer 24. The n-type InGaAlP guide layer 28 and the p-type InGaAlP guide layer 29 form, along with the n-type InGaAlP clad layer 27 and the p-type InGaAlP clad layer 30, an optical confinement structure of confining the light in the light-emitting layer 24. This provides an efficient recombination of electrons and holes in the light-emitting layer 24. The n-type InGaAlP guide layer 28 is formed of an n-type semiconductor, for example, by doping Si as an n-type dopant into InGaAlP, and the p-type InGaAlP guide layer 29 is formed of a p-type semiconductor, for example, by doping Mg as a p-type dopant into InGaAlP.

For example, the light-emitting layer 24 has an MQW (multiple-quantum well) structure, which is intended to amplify the light generated through the recombination of electrons and holes. In this embodiment, the light-emitting layer 24 has the MQW structure formed by alternately laminating a quantum well layer formed of an InGaP layer and a barrier layer formed of the InGaAlP layer multiple times.

The III-V group semiconductor laminated structure 21 has a pair of end surfaces 9 and 10 (a laser-emitting end surface 9 and an opposite end surface 10) parallel to each other. The end surfaces 9 and 10 may be mirror surfaces formed by cleavage. These end surfaces 9 and 10 may be covered by a front end surface insulating film 32 and a rear end surface insulating film 33 (reflective layers formed of, for example, $ZrO_2$), respectively, in order to excite an oscillation due to total reflection. A luminosity center 34 is present in a position of the light-emitting layer 24 of the front end surface insulating film 32.

Thus, the n-type InGaAlP guide layer 28, the light-emitting layer 24, and the p-type InGaAlP guide layer 29 form a Fabry-Perot resonator in which the end surfaces 9 and 10 are resonator end surfaces. In other words, the light emitted at the light-emitting layer 24 is amplified by stimulated emission while it is traveling back and forth between the laser-emitting end surface 9 and the opposite end surface 10. A part of the amplified light is emitted to the exterior of the semiconductor laser diode 5 as an output light from the laser-emitting end surface 9, and a part of the amplified light is emitted to the photodiode region 3 as a monitoring light from the opposite end surface 10.

The n-type electrode 22 and the p-type electrode 23 may be formed of Au or Au alloy, for example, and are in ohmic contact with the substrate 20 and the p-type electrode under layer 31, respectively. With such a configuration, it is possible to connect the n-type electrode 22 and the p-type electrode 23 to a power supply and inject electrons and holes from the LD-n type semiconductor layer 25 and the LD-p type semiconductor layer 26 into the light-emitting layer 24 so that electrons and holes are recombined in the light-emitting layer 24, thus generating a light having an emission wavelength of 790 nm-845 nm. This light is amplified by the stimulated emission while it is traveling back and forth along the guide layers 28 and 29 between the laser-emitting end surface 9 and the opposite end surface 10. Then, more laser output may be emitted from the laser-emitting end surface 9 to the outside.

According to some embodiments, the reason for mounting the semiconductor laser diode 5 in the facing downward posture to the sub-mount 4 is as follows. In general, in the semiconductor laser diode 5 of the end surface-emitting type, the light-emitting layer 24 is closer to the p-type electrode 23 than to the n-type electrode 22, in the laminating direction of the semiconductor laser diode 5. Therefore, heat generated from the semiconductor laser diode 5 can be more efficiently dissipated by mounting the semiconductor laser diode 5 on the sub-mount 4 with the p-type electrode 23 being disposed as a bottom surface (junction down) contacting the sub-mount 4.

In addition, since the semiconductor laser diode 5 is a semiconductor element, the intensity of the laser light output may have a significantly different value even though the same power is supplied due to the variation in the element characteristics. In some embodiments, when performing an initial setting of a hard disk device in which a magnetic head is incorporated, a power leading to a proper output of the laser light is searched, and the power searched at the initial setting is supplied to the semiconductor laser diode 5 during the subsequent operations. Because the laser light is also emitted from the opposite end surface 10 which is opposite to the luminosity center 34 of the light-emitting layer 24 in the semiconductor laser diode 5 as shown by the dashed line in FIG. 2, the intensity of the laser light (output light) emitted from the luminosity center 34 can be evaluated by detecting the intensity of the laser light emitted from the opposite end surface 10.

Therefore, the laser module 1 has a photodiode 6 built in the sub-mount 4 for detecting the intensity of the output light. The built-in photodiode 6 includes a PD-n type semiconductor layer 35 as a second conductivity type region formed of the sub-mount 4 (Si substrate) in the photodiode region 3, a PD-p type semiconductor layer 36 as a first conductivity type layer formed into a well in a surface portion of the PD-n type semiconductor layer 35, and a PD-i type semiconductor layer 37 of low-impurity concentration interposed between the PD-n type semiconductor layer 35 and the PD-p type semiconductor layer 36. The PD-n type semiconductor layer 35 and the PD-p type semiconductor layer 36 are heavily doped with impurities.

The PD-p type semiconductor layer 36 forms the light-receiving surface 11 in the surface 7 of the sub-mount 4, and the light-receiving surface 11 is covered with an anti-reflection film 38. A depth $D_1$ of the PD-p type semiconductor layer 36 measured from the light-receiving surface 11 is 1 μm-5 μm, for example. The PD-i type semiconductor layer 37 surrounds a periphery and a bottom of the PD-p type semiconductor layer 36. A portion of the PD-i type semiconductor layer 37 forms a part of the surface 7 of the sub-mount 4. The PD-n type semiconductor layer 35 surrounds a periphery and a bottom of the PD-i type semiconductor layer 37. A portion of the PD-n type semiconductor layer 35 forms a part of the surface 7 of the sub-mount 4. The portion of the PD-n type semiconductor layer 35 and the portion of PD-i type semiconductor layer 37 forming the surface 7 of the sub-mount 4 are covered with the surface insulating film 19.

In addition, a depth $D_2$ of the PD-i type semiconductor layer 37 measured from the light-receiving surface 11 is 10 μm-50 μm, for example. A depletion layer 39 is formed from the interface between the PD-p type semiconductor layer 36 and the PD-i type semiconductor layer 37. In some embodiments, a thickness W of the depletion layer 39 (a depth measured from the surface 7 of the sub-mount 4) is 20 μm-45 μm.

With such a configuration, if photons with the energy greater than a band gap of the PD-i type semiconductor layer 37 are irradiated as a monitoring light having an emission wavelength of 790 nm-845 nm from the opposite end surface 10 of the semiconductor laser diode 5, the monitoring light causes electron-hole pairs to be generated in the PD-i type semiconductor layer 37. When a reverse bias voltage is applied between the PD cathode electrode 14 and the PD anode electrode 13 of the photodiode 6, electrons and holes are swept in opposite directions, respectively, by an electric field. Thus, the electrons move toward the PD-n type semiconductor layer 35 and holes move toward the PD-p type semiconductor layer 36, thereby generating a photocurrent.

In the laser module 1 described above, a peak light-receiving wavelength at which the photocurrent of the photodiode 6 has its maximum value is set to be greater than or equal to a minimum emission wavelength and less than or equal to a maximum emission wavelength of the semiconductor laser diode 5 (a minimum emission wavelength≤a peak light-receiving wavelength≤a maximum emission wavelength). For example, 790 nm≤the peak light-receiving wavelength≤845 nm in this embodiment. The light-receiving wavelength and the photocurrent of the photodiode 6 have a relationship in which the photocurrent increases with the increase in the light-receiving wavelength until it reaches a maximum value (the peak light-receiving wavelength), and then the photocurrent decreases with the increase in the light-receiving wavelength.

Therefore, if the minimum emission wavelength≤the peak light-receiving wavelength≤the maximum emission wavelength, magnitudes of the photocurrent are divided into a short wavelength side and a long wavelength side with the peak light-receiving wavelength at which the photocurrent reaches its maximum value as a boundary. Thus, it is possible to reduce a difference between the maximum value and the minimum value of the photocurrent in the range of the emission wavelength. As a result, even if the emission wavelength of the light-emitting element varies in a certain range depending on the temperature, it is possible to reduce a fluctuation range of light-receiving sensitivity of the photodiode 6.

Various embodiments above will be explained based on the following examples. However, the present disclosure is not limited to the following examples.

EXAMPLES

Figure 3:
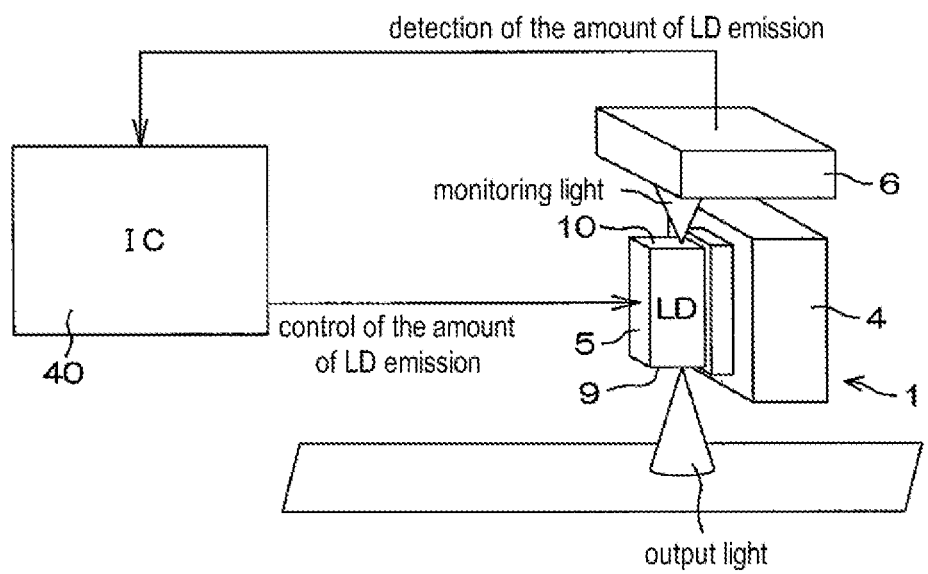
FIG. 3 is a block diagram illustrating a photodiode in a laser module, according to some embodiments.

FIG. 3 is a diagram illustrating a function of the photodiode 6 in the laser module 1. In FIG. 3, the photodiode 5 may be disposed outside the sub-mount 4 for convenience of reference. As shown in FIG. 3, the photodiode 6 mounted on the laser module 1 convert a laser light (a monitoring light) emitted from the opposite end surface 10 of the semiconductor laser diode (LD) 5 into a photocurrent, and sends the photocurrent as a monitoring current to an integrated circuit (IC) 40. The integrated circuit 40 detects an amount of emission of the laser light (output light) emitted from the laser-emitting end surface 9 of the semiconductor laser diode 5, based on the magnitude of the monitoring light received from the photodiode 6. Then, based on the detected amount of emission, the integrated circuit 40 controls the amount of emission of the semiconductor laser diode 5 so as to keep the output light of the semiconductor laser diode 5 constant.

Therefore, in order to perform such a feedback control with high accuracy, there is a need to keep the light-receiving sensitivity of the photodiode 6 constant even though the ambient environment (such as temperature) changes, so that the magnitude of the photocurrent sent from the photodiode 6 to the integrated circuit 40 does not vary in spite of the variation of the light-receiving sensitivity for the same amount of light emission. In other words, when a laser light having a certain amount of light emission is being emitted, it is preferable to send a constant photocurrent corresponding to the amount of light emission to the integrated circuit 40.

Here, the light-receiving sensitivity is an efficiency of conversion from the energy of the light incident on the photodiode 6 into an electrical signal of the photocurrent. In particular, the light-receiving sensitivity is a percentage of electron-hole pairs that can be taken out when one photon of the photodiode 6 comes in.

Figure 4:
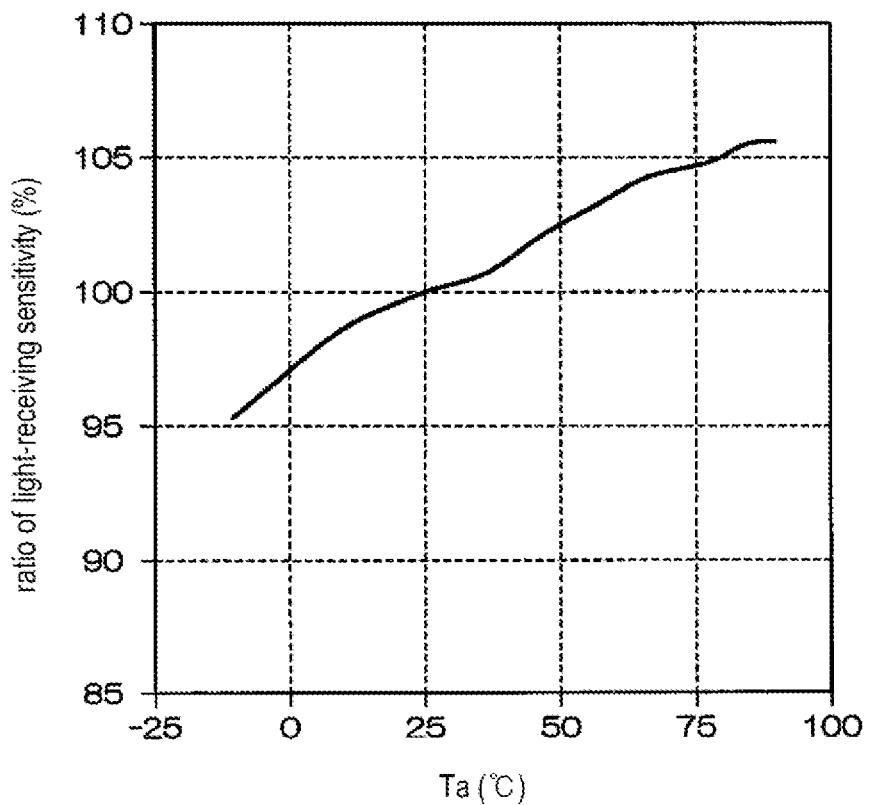
FIG. 4 is a graph showing a temperature characteristic of a photodiode.

FIG. 4 is a graph showing a temperature characteristic of a photodiode. As shown in FIG. 4, a light-receiving sensitivity of the photodiode has a positive temperature coefficient. For example, if the light-receiving sensitivity is 100% when the temperature is 25 degrees C., the light-receiving sensitivity increases when the temperature increases over 25 degrees C. As in the laser module 1, when the photodiode 6 is formed in the sub-mount 4 which also functions as a heat sink of the semiconductor laser diode 5 so that the temperature of the sub-mount 4 increases due to the output (heat generation) of the semiconductor laser diode 5, the heat generated with the output of the semiconductor laser diode 5 is transmitted to the photodiode 6 through the sub-mount 4. Therefore, it is difficult to keep the light-receiving sensitivity of the photodiode 6 constant in relation to temperature.

Figure 5:
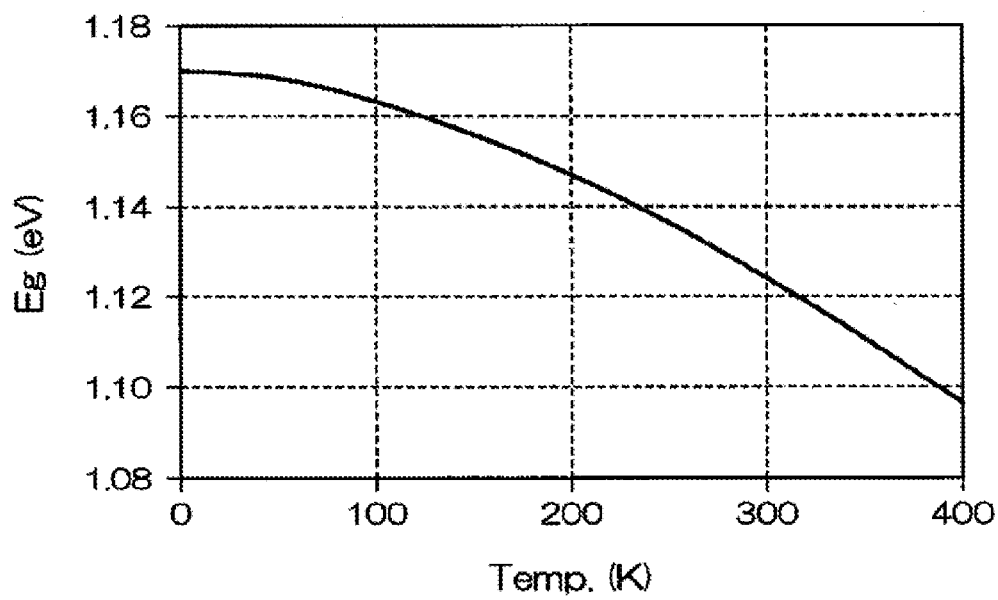
FIG. 5 is a graph showing a relationship between a temperature and a band gap of Si, according to some embodiments.

In considering the factor causing the light-receiving sensitivity of the photodiode 6 to have a positive temperature coefficient, the base of the photodiode 6 may be Si substrate (sub-mount 4). Furthermore, as shown in FIG. 5, the band gap of Si decreases with the increase in temperature. In the photodiode 6, a light absorption occurs when photons having the energy greater than the band gap of the PD-i type semiconductor layer 37 are irradiated. Therefore, if the band gap of Si decreases with the increase in temperature of the sub-mount 4 so that the light absorption is prone to occur, then, as a result, a generation ratio of electron-hole pairs increases, thereby increasing the light-receiving sensitivity of the photodiode 6.

Figure 6:
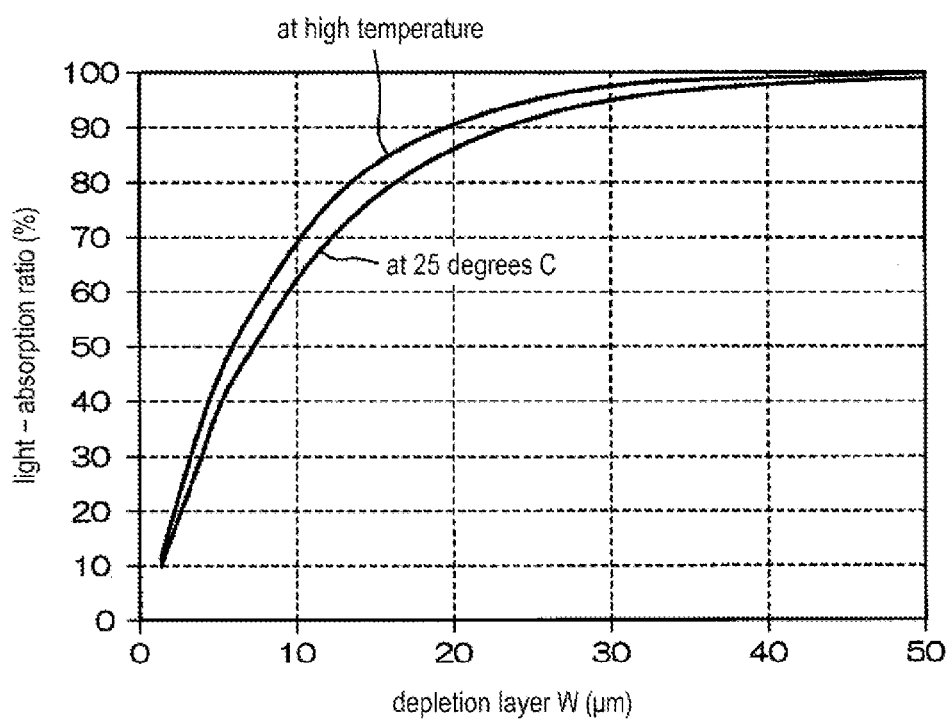
FIG. 6 is a graph showing a relationship between a thickness W of a depletion layer and a light absorption rate of the photodiode, according to some embodiments.

For example, in order to improve the temperature characteristic of such a light-receiving sensitivity (in other words, in order to keep the light-receiving sensitivity constant regardless of temperature), a temperature change rate (%) indicated by an amount of change in the light-receiving sensitivity at the temperature of T degrees C. over the light-receiving sensitivity at 25 degrees C. (=an amount of change in the light-receiving sensitivity/the light-receiving sensitivity at 25 degrees C.) may be lowered, and the light-receiving sensitivity at 25 degrees C. may be maintained, even though the temperature is high or low. Referring to FIG. 6, when the light-receiving sensitivity at 25 degrees C. and the light-receiving sensitivity at the temperature higher than 25 degrees C. are compared with each other, both increase in their light absorption rates with the increase in the thickness W of the depletion layer 39. When the thickness W of the depletion layer 39 is thin (e.g., about 15 μm), a difference of approximately 10% occurs between the light absorption rates. The difference between the light absorption rates reaches its peak value when W is about 15 μm, and then the difference continues to decrease with the increase in the thickness W.

Figure 7:
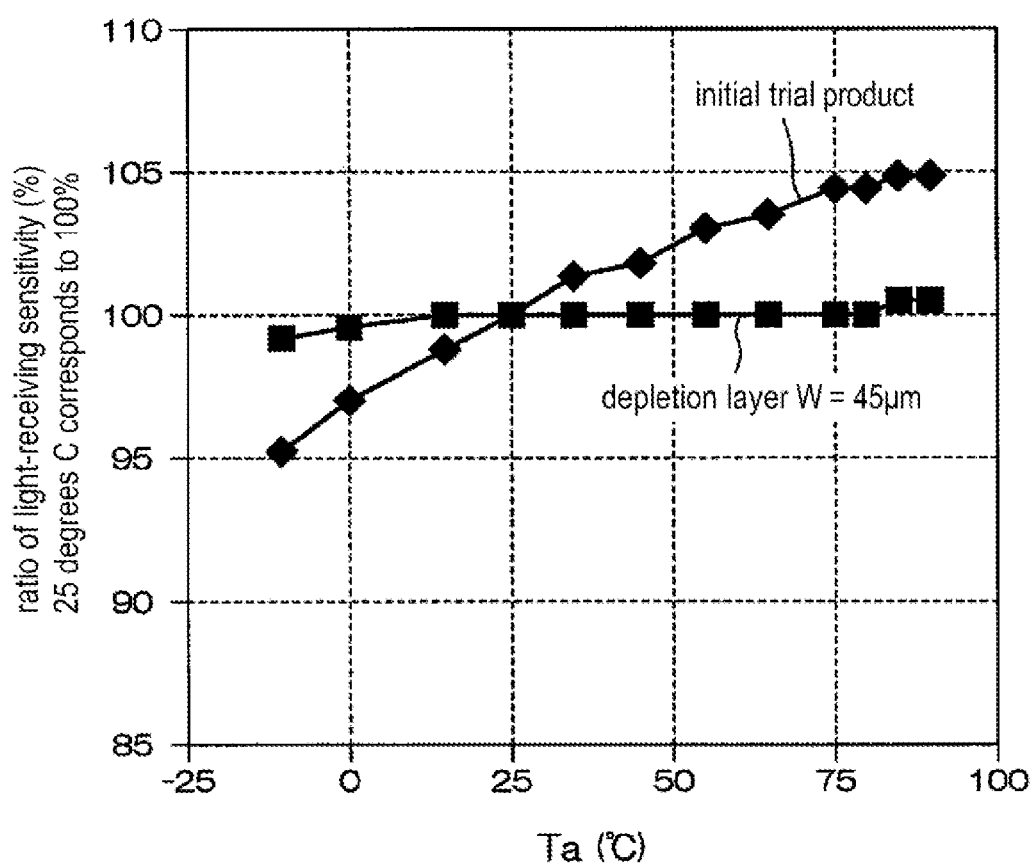
FIG. 7 is a graph showing an improved result of the temperature characteristic of the photodiode, according to some embodiments.

When the photodiode 6 is fabricated under the condition that the thickness W of the depletion layer is 45 μm, the temperature characteristic of the light-receiving sensitivity of the photodiode 6 may be improved significantly. The result is shown in FIG. 7. In other words, as shown in FIG. 7, if the photodiode 6 has a light absorption rate of about 100% (the thickness W of the depletion layer is 45 μm), the light-receiving sensitivity can be kept almost constant regardless of how much the temperature changes.

Figure 8B:
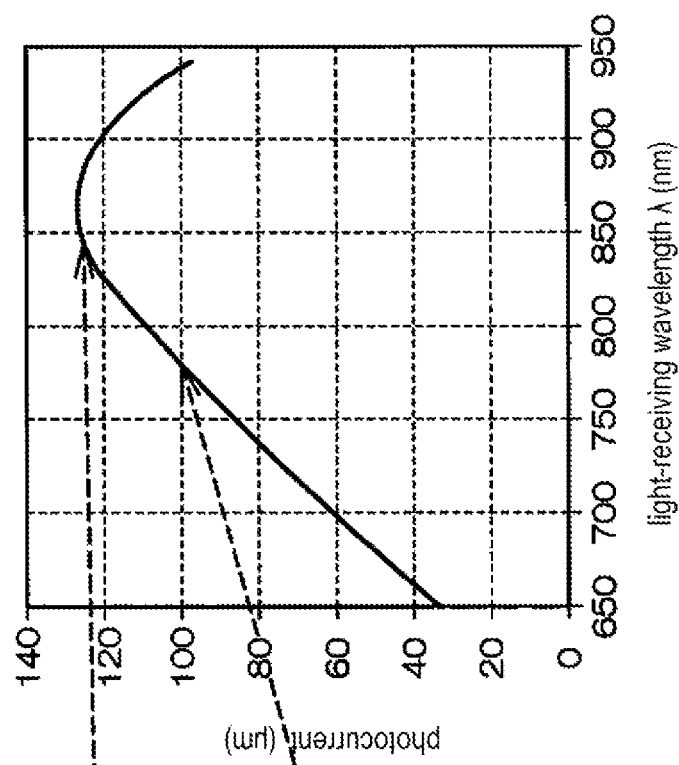
FIGS. 8A and 8B are graphs illustrating a wavelength-temperature dependency of a photocurrent of the photodiode, according to some embodiments, where
Figure 8A:
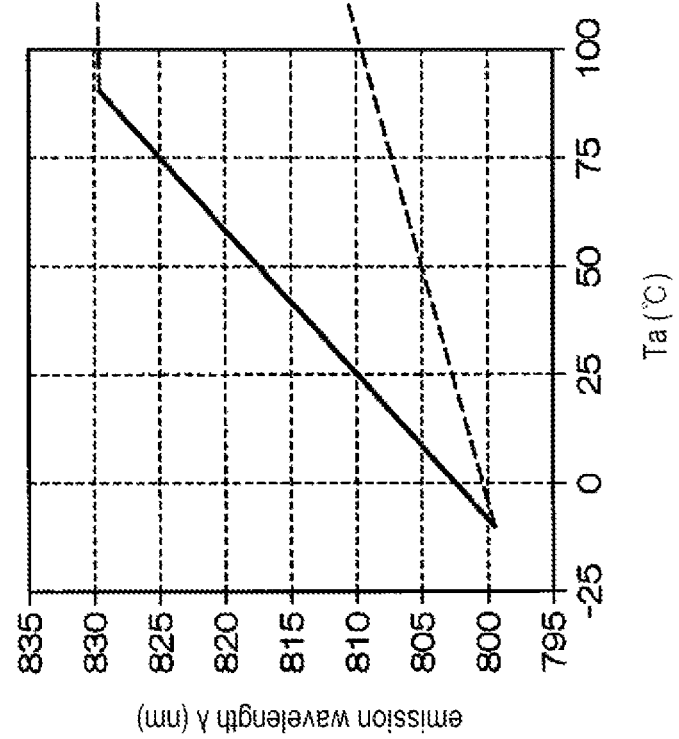

The light-receiving sensitivity of the photodiode 6 depends on not only the temperature but also the wavelength (light-receiving wavelength) of the laser light which is incident on the light-receiving surface 11, and the emission wavelength of the semiconductor laser diode 5 emitting the laser light is affected by the temperature. This is specifically shown in FIGS. 8A and 8B. As shown in FIG. 8A, the emission wavelength of the semiconductor laser diode 5 increases with the increase in temperature. In the example, a wavelength changes at a rate of 0.3 nm/degree C. On the other hand, it was examined how the light-receiving sensitivity of the photodiode 6 changes with the change in the light-receiving wavelength, and it was confirmed that the light-receiving sensitivity changes parabolically so that it has its peak value (maximum value) at a certain wavelength, as shown in FIG. 8B.

Figure 9A:
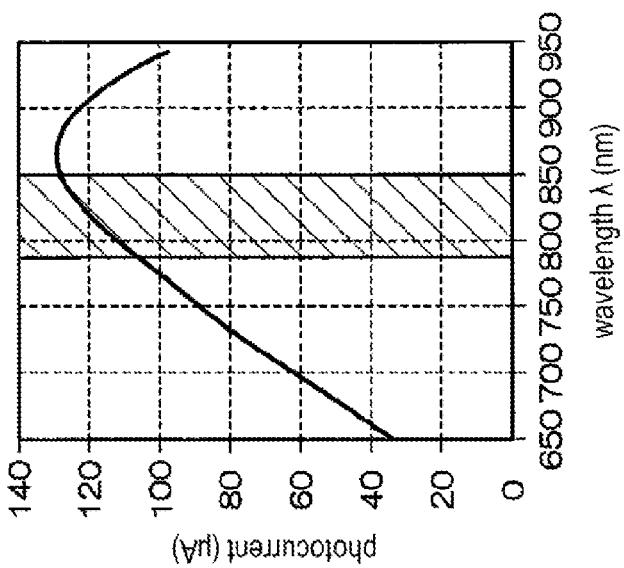
FIGS. 9A, 9B and 9C are graphs showing the spectral sensitivity characteristic of the photodiode, according to some embodiments, where
Figure 9B:
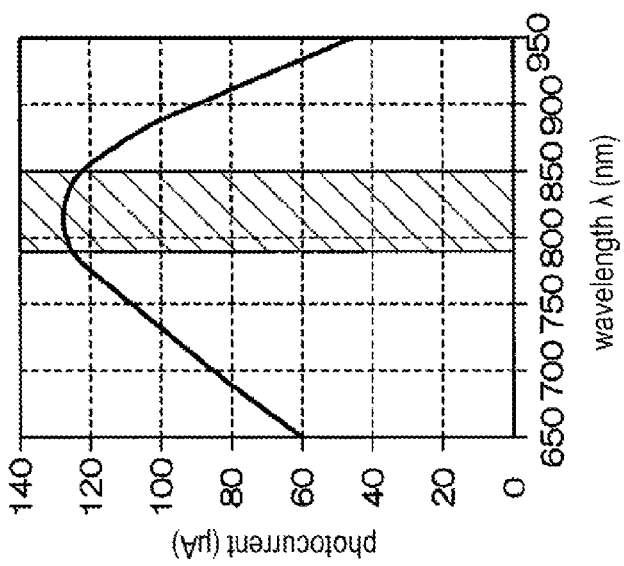
Figure 9C:
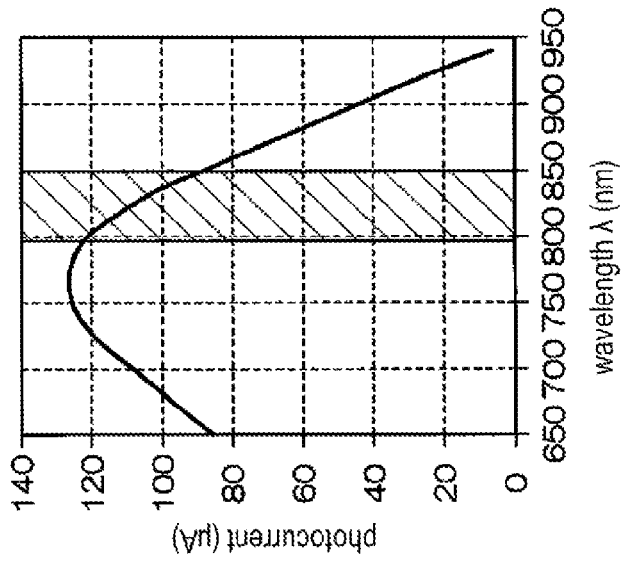

Therefore, in order to improve the temperature characteristic of the light-receiving sensitivity of the photodiode 6, total consideration including the wavelength change of the semiconductor laser diode 5 due to the temperature change is needed. For a proper dependency of the laser light on the wavelength, three cases of a relationship between the wavelength of the semiconductor laser diode 5 and the peak wavelength of the photodiode 6 are considered. More specifically, a wavelength range of the semiconductor laser diode 5 at 25 degrees C. is set to 790 nm-845 nm with considering the effect of the temperature change, and the cases are divided into three patterns: (1) peak light-receiving wavelength<minimum emission wavelength, (2) minimum emission wavelength≤peak light-receiving wavelength≤maximum emission wavelength, and (3) maximum emission wavelength<peak light-receiving wavelength. FIGS. 9A to 9C show the patterns (1) to (3), respectively. The wavelength range of the semiconductor laser diode 5 is indicated by hatching in FIGS. 9A to 9C.

In FIGS. 9A to 9C, the maximum emission wavelength and the minimum emission wavelength are the upper limit and the lower limit of an emission wavelength range, respectively, within which the semiconductor laser diode 5 emits a laser light. In some embodiment, the maximum emission wavelength and the minimum emission wavelength may be the upper limit and the lower limit of an emission wavelength range, respectively, within which a light emission spectrum of the semiconductor laser diode 5 has an intensity detectable by the photodiode 6.

As shown in FIG. 8A, the emission wavelength of the semiconductor laser diode 5 increases (i.e., shifts to a long wavelength) with an increase in temperature. In the example of FIG. 8A, the emission wavelength of the semiconductor laser diode 5 increases at a rate of 0.3 nm/degree C. Thus, the maximum emission wavelength and the minimum emission wavelength may change depending on the temperature of the semiconductor laser diode 5.

First, in the cases of FIGS. 9A and 9C, the magnitude of the photocurrent continues to decrease (FIG. 9A) and continues to increase (FIG. 9C) in the wavelength range of the semiconductor laser diode 5. Therefore, a difference between a maximum value and a minimum value of the photocurrent becomes large, so that a variation in the light-receiving sensitivity of the photodiode 6 becomes large. Additionally, when the minimum emission wavelength≤the peak light-receiving wavelength≤the maximum emission wavelength as shown in FIG. 9B, the magnitude of the photocurrent is divided into a short wavelength side and a long wavelength side with the peak light-receiving wavelength (around 820 nm) as a boundary, so that the difference between the maximum value and the minimum value of the photocurrent in the range of the emission wavelength becomes small. In other words, the effect of the wavelength change of the semiconductor laser diode 5 becomes small by setting the condition as shown in FIG. 9B. In particular, the peak light-receiving wavelength of the photodiode 6 may be within ±5% of a median of the emission wavelength of the semiconductor laser diode 5.

As described above, the emission wavelength of the semiconductor laser diode 5 may change depending on the temperature of the semiconductor laser diode 5, and thus the median of the emission wavelength may also change depending on the temperature.

In addition, as shown in FIGS. 6 and 7, the thickness W of the depletion layer 39 may be 20 µm to 45 µm, from the viewpoint of reducing the change rate of temperature of the photodiode 6. However, when the thickness W is in this range, the peak light-receiving wavelength of the photodiode 6 is shifted to the long wavelength side so that the peak is sharpened and the flatness in the range of emission wavelength becomes impaired, as shown in FIG. 10.

Figure 10:
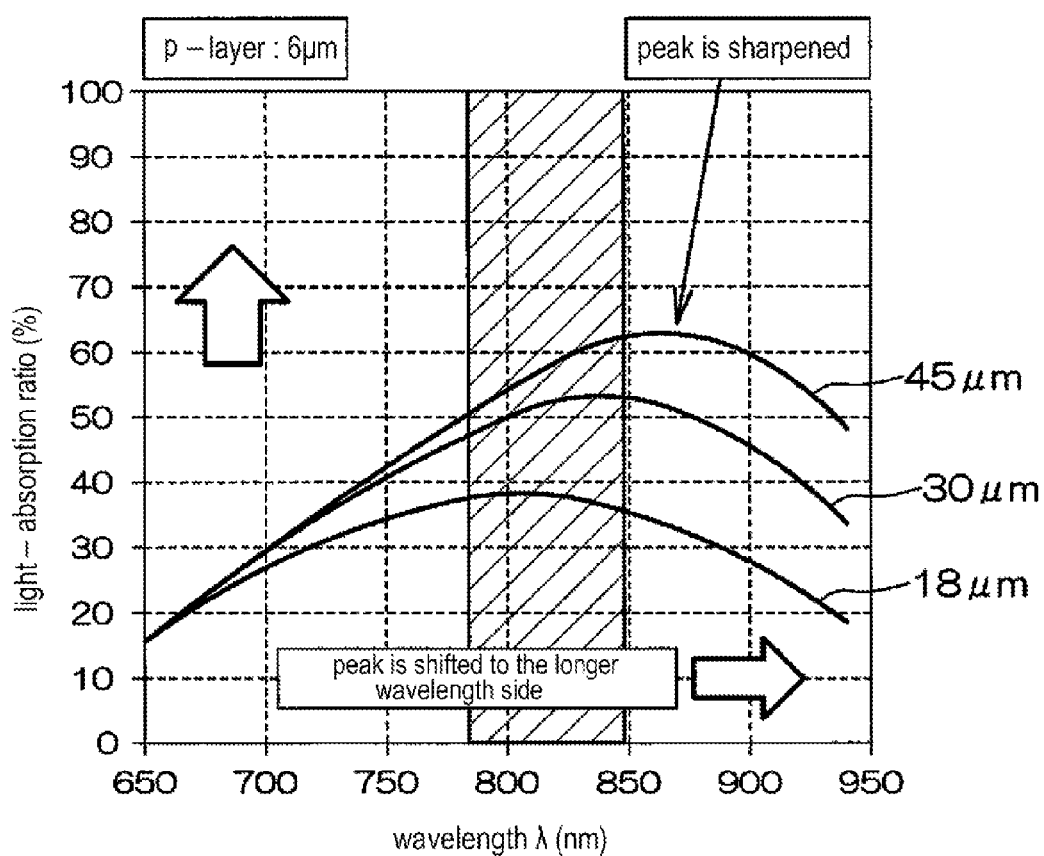
FIG. 10 is a graph illustrating a change in the spectral sensitivity characteristic of the photodiode due to a change of the thickness W of the depletion layer, according to some embodiments.
Figure 11:
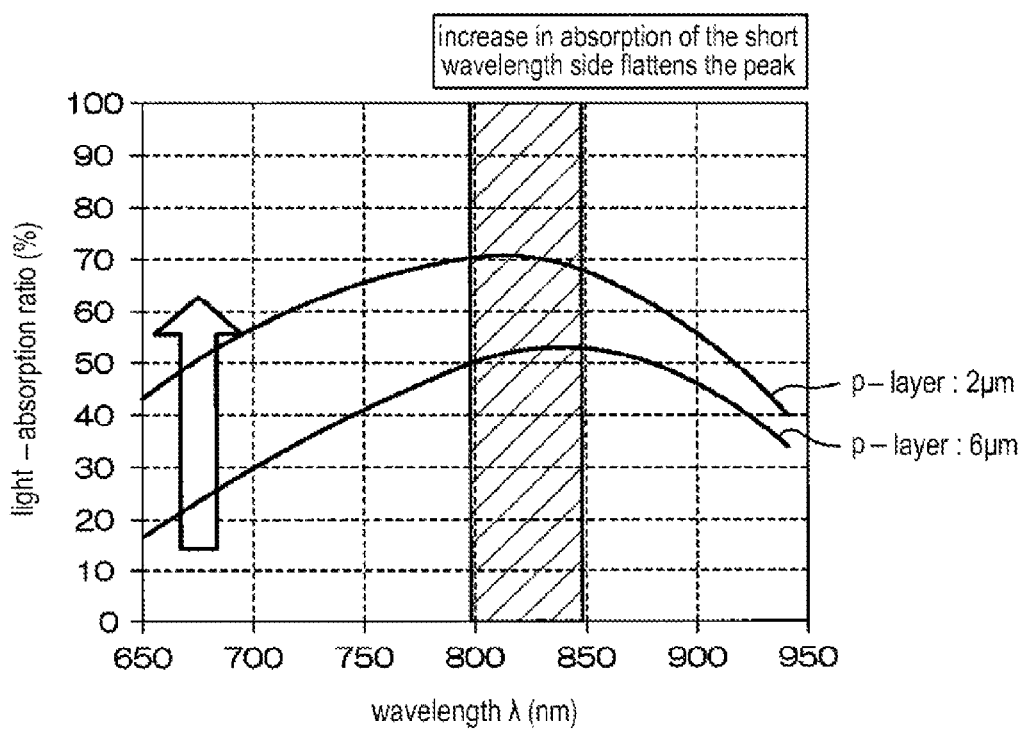
FIG. 11 is a graph illustrating a change in the spectral sensitivity characteristic of the photodiode due to a change of a depth $D_1$ of a PD-p type semiconductor layer, according to some embodiments.

Further, in FIG. 10, the depth $D_1$ of the PD-p type semiconductor layer 36 (p-layer) was set as 6 nm, and the change in the peak light-receiving wavelength was examined for three patterns of the thickness W of the depletion layer 39: 18 µm, 30 µm and 45 µm. Among these three patterns, for the case of 30 µm where the change rate of temperature of the photodiode 6 can be reduced, how the peak light-receiving wavelength of the photodiode 6 changes was examined with two patterns of the depth $D_1$ of the PD-p type semiconductor layer 36: 2 µm and 6 µm. According to the examination, if the depth $D_1$ of the PD-p type semiconductor layer 36 is shallow (thin), the light absorption rate of the short wavelength side increases so that the shape around the peak light-receiving wavelength can be flattened. FIG. 11 shows the results.

Figure 12:
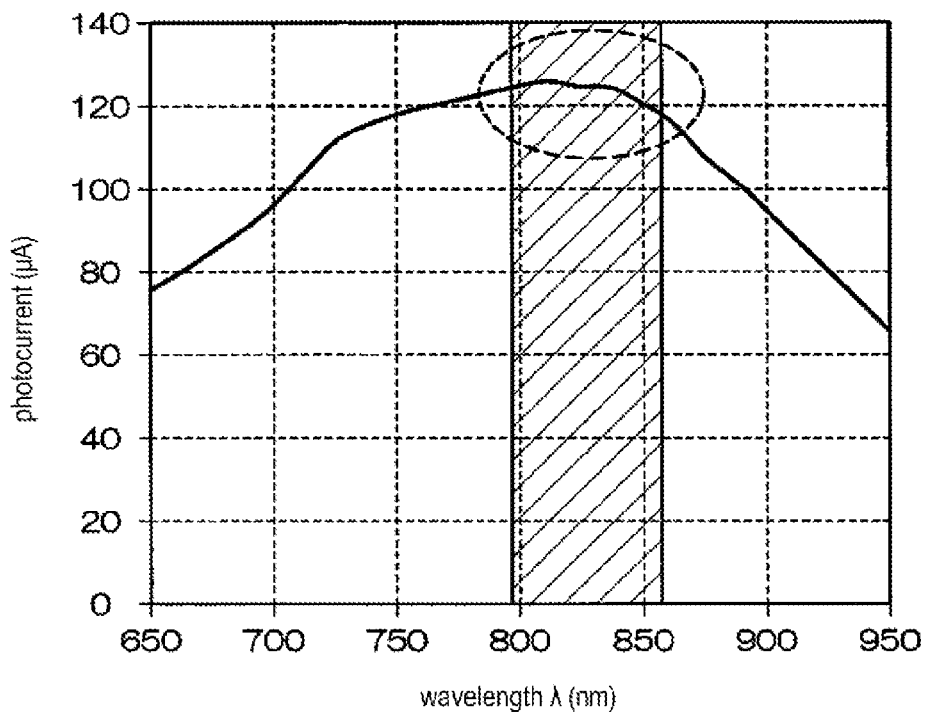
FIG. 12 is a graph showing the spectral sensitivity characteristic of the photodiode, according to some embodiments.
Figure 13:
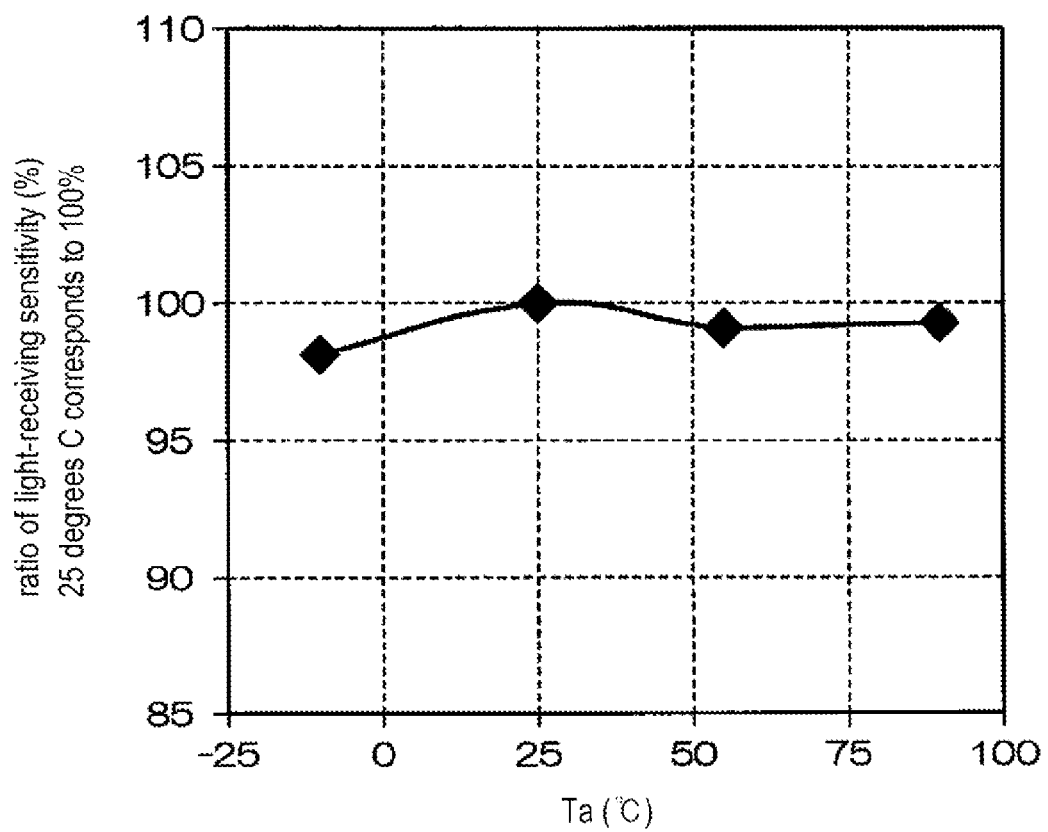
FIG. 13 is a graph showing the temperature characteristic of the photodiode, according to some embodiments.

According to the considerations as described above, the laser module 1 including the photodiode 6 in which the depletion layer 39 has a thickness W of 30 µm and the PD-p type semiconductor layer 36 has a depth $D_1$ of 2 µm was fabricated and investigated for its spectral sensitivity. According to the investigation, a gradual spectral sensitivity curve was obtained with its peak value at the wavelength of about 810 nm, as shown in FIG. 12. In addition, the temperature characteristic of the photodiode 6 of the laser module 1 was investigated. As a result of the investigation, a flattened temperature characteristic is obtained as shown in FIG. 13.

In addition to the embodiments described above, the present disclosure may be implemented in various other embodiments. For example, the conductivity type of each semiconductor portion may be inverted. The p-type portions may be turned into n-type portions, and the n-type portions may be turned into p-type portions. Further, the i-type semiconductor layer may be omitted.

In addition, in some embodiments, it is not necessary that the sub-mount 4 be formed of the same conductivity type semiconductor in its entirety. For example, it may be a substrate in which the n-type region is formed only in the photodiode region 3. In addition, the light-emitting element mounted on the sub-mount 4 is not limited to the semiconductor laser diode 5, but it may be a light-emitting diode (LED). In some embodiments, the light-emitting diode is arranged with the light-emitting surface facing upward.

The peak light-receiving wavelength at the maximum photocurrent of the photodiode may be greater than or equal to the minimum emission wavelength of the light-receiving wavelength and less than or equal to the maximum emission wavelength (minimum emission wavelength≤peak light-receiving wavelength≤maximum emission wavelength).

The light-receiving wavelength and the photocurrent of the photodiode have the relationship in which the photocurrent increases with the increase in the light-receiving wavelength until it reaches a maximum value (the wavelength at this time is called the peak light-receiving wavelength) until the light-receiving wavelength reaches a certain value, and then the photocurrent decreases with the increase in the light-receiving wavelength.

Therefore, if the minimum emission wavelength≤the peak light-receiving wavelength≤the maximum emission wavelength, magnitudes of the photocurrent may be divided into the short wavelength side and the long wavelength side with the peak light-receiving wavelength (at which the photocurrent reaches its maximum value) as a boundary. Thus, it is possible to reduce the difference between the maximum and minimum values of the photocurrent in the range of the emission wavelength. As a result, even if the emission wavelength of the light-emitting element varies in a given range depending on the temperature, it is possible to reduce the fluctuation range of light-receiving sensitivity of the photodiode 6.

While certain embodiments have been described, these embodiments have been presented by way of example only, and are not intended to limit the scope of the disclosure. Indeed, the novel methods and apparatuses described herein may be embodied in a variety of other forms; furthermore, various omissions, substitutions, combinations and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A sub-mount having a photodiode region, comprising:
   a laser diode light-emitting element that emits light having an emission wavelength which changes as temperature changes within a range of −10° C. and 90° C.; and
   a photodiode having a first conductivity-type layer arranged in a surface portion of the sub-mount in a photodiode region and configured to form a light-receiving surface, and having a second conductivity-type region arranged below the first conductivity-type layer, the photodiode being configured to receive at the light-receiving surface a light emitted from the light-emitting element and to convert the light into a photocurrent,
   wherein the photodiode additionally has a depletion layer generated from the first conductivity-type layer, the depletion layer having a thickness in the range 20 µm to 45 µm; and
   wherein a peak light-receiving wavelength at which the photocurrent of the photodiode becomes its maximum value is more than or equal to a minimum emission wavelength of the light-emitting element and less than or equal to a maximum emission wavelength of the light-emitting element.

2. The sub-mount of claim 1, wherein the peak light-receiving wavelength of the photodiode is within ±5% of a median emission wavelength of the light-emitting element.

3. The sub-mount of claim 1, wherein the photodiode is configured to receive the light whose emission wavelength ranges from 790 nm to 845 nm emitted from the light-emitting element.

4. The sub-mount of claim 1, wherein the first conductivity-type layer has a depth of 1 µm to 5 µm.

5. The sub-mount of claim 1, wherein the photodiode includes an i-type semiconductor layer interposed between the first conductive-type layer and the second conductive-type region.

6. The sub-mount of claim 1, wherein the second conductivity-type region surrounds a periphery and a bottom portion of the first conductivity-type layer and wherein a portion of the second conductivity-type region is configured to form a portion of the surface of the sub-mount.

7. The sub-mount of claim 6, wherein the photodiode includes a first electrode connected to the first conductive-type layer and a second electrode connected to the second conductive-type region, the first electrode and the second electrode being formed on the surface of the sub-mount.

8. The sub-mount of claim 1, wherein the sub-mount is made of Si.

9. A light-emitting element module, comprising:
   a laser diode light-emitting element that emits light having an emission wavelength which changes as temperature changes within a range of −10° C. and 90° C.,
   a sub-mount comprising a photodiode having a first conductivity-type layer arranged in a surface portion of the sub-mount in a photodiode region and configured to form a light-receiving surface, and having a second conductivity-type region arranged below the first conductivity-type layer, the photodiode being configured to receive at the light-receiving surface a light emitted from the light-emitting element and to convert the light into a photocurrent,
   wherein the light-emitting element is fixed on a surface of the sub-mount in a light-emitting element region adjacent to the photodiode region,
   wherein the photodiode additionally has a depletion layer generated from the first conductivity-type layer, the depletion layer having a thickness in the range 20 µm to 45 µm, and
   wherein a peak light-receiving wavelength at which the photocurrent of the photodiode becomes its maximum value is more than or equal to a minimum emission wavelength of the light-emitting element and less than or equal to a maximum emission wavelength of the light-emitting element.

10. The light-emitting element module of claim 9, wherein the light-emitting element module includes a laser diode having a laser-emitting end surface and an opposite end surface opposite the laser-emitting end surface, the laser diode being arranged with the opposite end surface facing the light-receiving surface.

11. The light-emitting element module of claim 9, wherein the light-emitting element module includes a light-emitting diode having a light-emitting surface, the light-emitting diode being arranged with the light-emitting surface facing upward.

* * * * *